United States Patent [19]
Yamanaka

[11] Patent Number: 5,863,674
[45] Date of Patent: Jan. 26, 1999

[54] BATTERY TERMINALS FOR A MINIATURE ELECTRONIC APPARATUS AND STRUCTURE FOR HOLDING THE SAME

[75] Inventor: Toshiki Yamanaka, Shizuoka, Japan

[73] Assignee: NEC Corporation, Tokyo, Japan

[21] Appl. No.: 855,471

[22] Filed: May 13, 1997

[30] Foreign Application Priority Data

May 14, 1996 [JP] Japan .................................... 8-118664

[51] Int. Cl.$^6$ .......................... H01M 2/10; H01R 13/72
[52] U.S. Cl. ......................... 429/100; 429/96; 439/500; 439/620; 361/767
[58] Field of Search ..................... 429/100, 96; 439/500, 439/506, 620; 361/767

[56] References Cited

U.S. PATENT DOCUMENTS

| | | | |
|---|---|---|---|
| 3,881,961 | 5/1975 | Nation | 429/100 X |
| 5,607,795 | 3/1997 | Saida | 429/100 |
| 5,707,249 | 1/1998 | Byrd | 439/500 |

FOREIGN PATENT DOCUMENTS 5-45019  11/1993  Japan .
8-203487  8/1996  Japan .

*Primary Examiner*—John S. Maples
*Attorney, Agent, or Firm*—Young & Thompson

[57] ABSTRACT

A battery terminal holding structure of the present invention and applicable to a miniature electronic apparatus includes a casing for accommodating a battery, and a printed circuit board loaded with electronic parts. A positive and a negative battery terminal each having resiliency and conductivity are affixed to the casing at one end and to the circuit board at the other end. The two battery terminals each includes ribs and bent portions. When the ribs of the battery terminals are inserted in notches formed in the circuit board, the bent portions of the terminals resiliently nip and press associated electrodes provided on the circuit board so as to set up electrical connection. Another rib extends out from each battery terminal and is inserted in a groove formed in the casing, positioning the circuit board relative to the casing. The battery has its positive and negative terminals respectively held in contact with the battery terminals within the casing. Such a structure makes it needless to solder the battery terminals to the circuit board and thereby saves cost while promoting recycling of the structural elements.

6 Claims, 4 Drawing Sheets

BATTERY TERMINALS FOR A MINIATURE ELECTRONIC APPARATUS AND STRUCTURE FOR HOLDING THE SAME

BACKGROUND OF THE INVENTION

The present invention relates to the structure of a battery holding section of a miniature electronic apparatus and, more particularly, to battery terminals and a structure for holding the same.

It has been customary with a miniature electronic apparatus including a battery storing section to affix battery terminals to electrodes provided on a printed circuit board by soldering. A battery holder using this kind of scheme is taught in, e.g., Japanese Utility Model Publication No. 5-45019. The battery holder disclosed in this document has a casing for storing a battery therein, a terminal plate located at one end of the casing, and a conical coil spring located at the other end of the casing. However, a problem with the battery holder is that a substantial period of time is necessary for the terminal plate and circuit board to be soldered, increasing the production cost of the apparatus. Another problem is that the terminal plate, coil spring and circuit board cannot be readily separated from each other, resulting in time-consuming maintenance and obstructing recycling of such structural elements.

Japanese Patent Laid-Open Publication No. 8-203487 also teaches a technology relating to the present invention.

SUMMARY OF THE INVENTION

It is therefore an object of the present invention to provide battery terminals for a miniature electronic apparatus and capable of being affixed to a printed circuit board without resorting soldering, and a structure for holding the same.

It is another object of the present invention to provide battery terminals for a miniature electronic apparatus and promoting recycling of structural elements, and a structure for holding the same.

A structure for holding battery terminals included in a miniature electronic apparatus of the present invention has a printed circuit board loaded with electronic parts, a pair of resilient conductive battery terminals, and a casing for accommodating a battery therein, and affixed to the printed circuit board via the pair of battery terminals. The printed circuit board has, at each of opposite end portions thereof, an electrode for contacting one of the battery terminals, a notch adjoining the electrode for receiving and positioning the one battery terminal, and a hole for positioning the printed circuit board relative to the casing. The battery terminals each has a contact surface for contacting one of a positive and a negative terminal of the battery, a first rib affixed to and positioned by the casing, a second rib received in and positioned by the notch of the printed circuit board, and a plurality of bent portions each having a substantially U-shaped cross-section for resiliently nipping and pressing one of the electrodes of the printed circuit board. The casing has, at each of opposite end portions thereof, a groove for receiving and positioning the first rib, and a positioning member to be inserted in the hole of the printed circuit board.

BRIEF DESCRIPTION OF THE DRAWINGS

The above and other objects, features and advantages of the present invention will become apparent from the following detailed description taken with the accompanying drawings in which.

DESCRIPTION OF THE PREFERRED EMBODIMENT

Figure 1A:
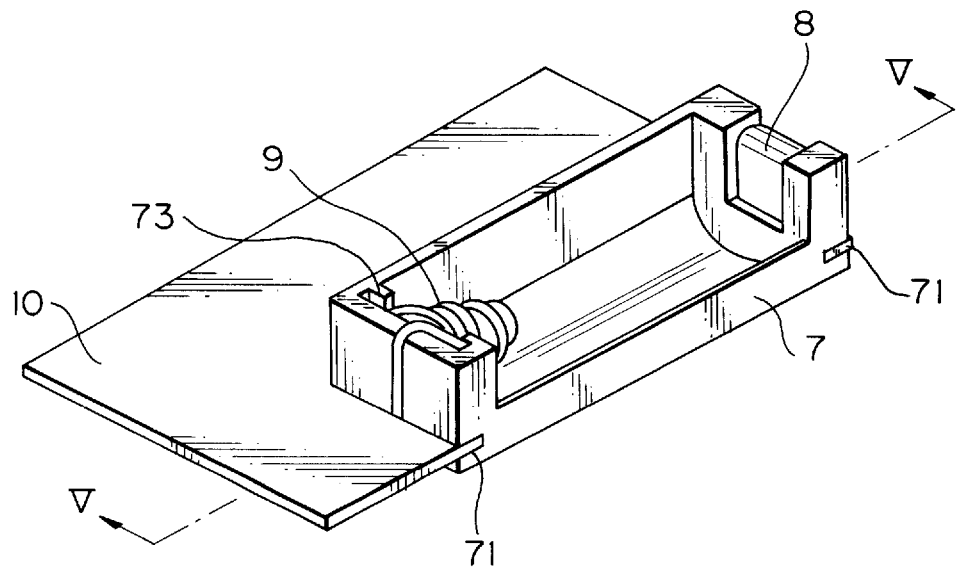
FIG. 1A is a perspective view showing a specific conventional structure of a battery holder.
Figure 1B:
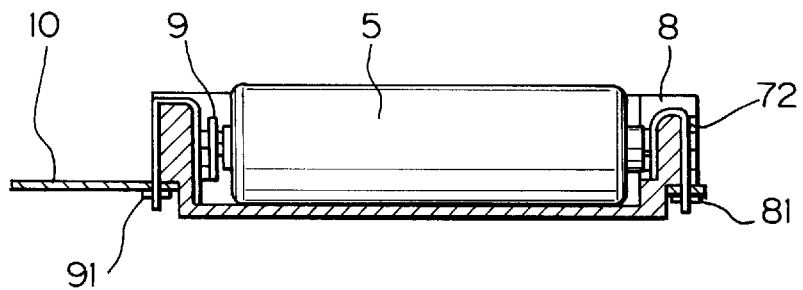
FIG. 1B is a section along line V—V of FIG. 1A.

To better understand the present invention, brief reference will be made to a battery holder taught in Japanese Utility Model Publication No. 5-45019 mentioned earlier. As shown in FIGS. 1A and 1B, the battery holder has a casing 7 for accommodating a battery 5 therein, a terminal plate 8 located at one end of the casing 7, and a conical coil spring 9 located at the other end of the casing 7. A groove 71 is formed in the outer periphery of the casing 7, as illustrated. A printed circuit board 10 is partly notched in the form of a letter U and fitted in the groove 71. As shown in FIG. 1B, the terminal plate 8 is implemented as a sheet bent in the form of a letter U and positioned upside down. The terminal plate 8 has a lead portion 81 inserted in a bore 71 formed in one end of the casing 7. The lead portion 81 is soldered to a positive electrode provided on the circuit board 10. The coil spring 9 is partly received in a bore 73 formed in the other end of the casing 7. The part of the spring 9 received in the bore 73 has its end soldered to a negative electrode also provided on the circuit board 10.

The battery holder having the above configuration has the following problems left unsolved.

(1) After the terminal plate 8 has been inserted in the bore 72 of the casing 7, the lead portion 81 of the plate 8 is soldered to the positive electrode of the circuit board 10. Further, after the coil spring 9 has been inserted in the bore 73 of the circuit board 7, the end 91 of the spring 9 is soldered to the negative electrode of the circuit board 10. Such a procedure needs a substantial soldering time and increases the production cost of a miniature apparatus to which the battery holder is mounted.

(2) It is difficult to separate the terminal plate 8, coil spring 9 and printed circuit board 10 because the plate 8 and spring 9 are soldered to the board 10. This increases the period of time necessary for the maintenance of the apparatus to be completed.

(3) Moreover, the terminal plate 8 and coil spring 9 soldered to the circuit board 10 obstruct recycling of such parts.

Figure 2:
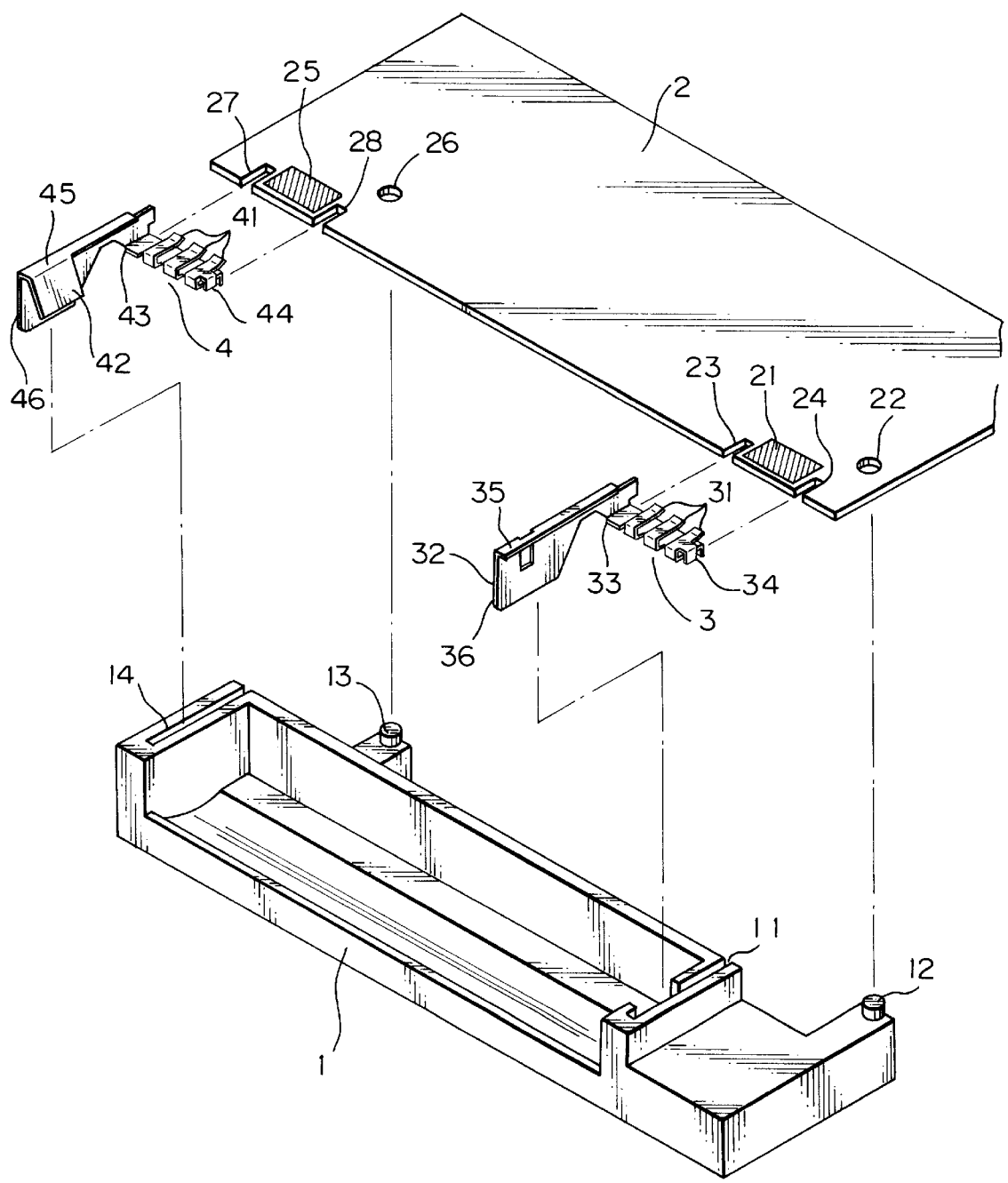
FIG. 2 is an exploded perspective view showing a battery terminal holding structure embodying the present invention.

Referring to FIG. 2, a battery terminal holding structure embodying the present invention will be described. As shown, the structure includes a casing 1 for accommodating a battery, not shown, therein. A printed circuit board 2 is loaded with various kinds of electronic parts, although not shown specifically. A positive terminal 3 and a negative terminal 4 are anchored to the circuit board 2 and respectively electrically connected to electrodes 21 and 25 provided on the circuit board 2.

Notches 23 and 24 and notches 27 and 28 are respectively formed in opposite end portions of the circuit board 2 in order to receive and retain the positive and negative terminals 3 and 4. Holes 22 and 26 are also formed in the circuit board 2 in order to receive and position pins 12 and 13, respectively, which are studded on the casing 1. The electrodes 21 and 25 are configured such that bent portions 31 and 41 extending from the positive and negative terminals 3 and 4 are press fitted on the electrodes 21 and 25, respectively. In this condition, the terminals 3 and 4 are electrically connected to the electrodes 21 and 25, as will be described more specifically later.

The positive and negative terminals 3 and 4 each is implemented by a resilient conductive sheet of metal provided with a deformed L-shaped configuration by bending. The positive terminal 3 includes a contact surface 32 for contacting the battery, ribs 33 and 34 to be respectively received in and positioned by the notches 23 and 24 of the circuit board 2, a bent wall 35 connecting the contact surface 32 and rib 33 for reinforcement, a rib 36 to be received in and positioned by a groove 11 formed in the casing 1, and the bent portions 31 mentioned previously. The bent portions 31 each having a generally U-shaped configuration resiliently nip the electrode 21 to set up electrical connection. The negative terminal 4 is substantially similar in configuration to the positive electrode 3 and has a contact surface 42, ribs 43 and 44 to be received in the grooves 27 and 28, a bent wall 45 connecting the contact surface 42 and rib 43, a rib 46 to be received in another groove 14 formed in the casing 1, and the bent portions 41 resiliently nipping the other electrode 25 for electrical connection. The rib 36 of the positive terminal 3 plays the role of the contact surface 32 at the same time.

The casing 1 having the grooves 11 and 14 and holes 12 and 13, as stated above, support the circuit board 2 and terminals 3 and 4 thereon. The casing 1, terminals 3 and 4 and circuit board 2 are affixed together without any play. This is because the ribs 36 and 46 are fitted in the associated grooves 11 and 14 under some pressure, because the ribs 22 and 23 and ribs 43 and 44 are received in the notches 23 and 24 and notches 27 and 28, and because the pins 12 and 13 are fitted in the holes 22 and 26 under some pressure.

The terminals or battery terminals 3 and 4 should preferably be implemented by resilient sheets of stainless steel and plated with gold.

Figure 3:
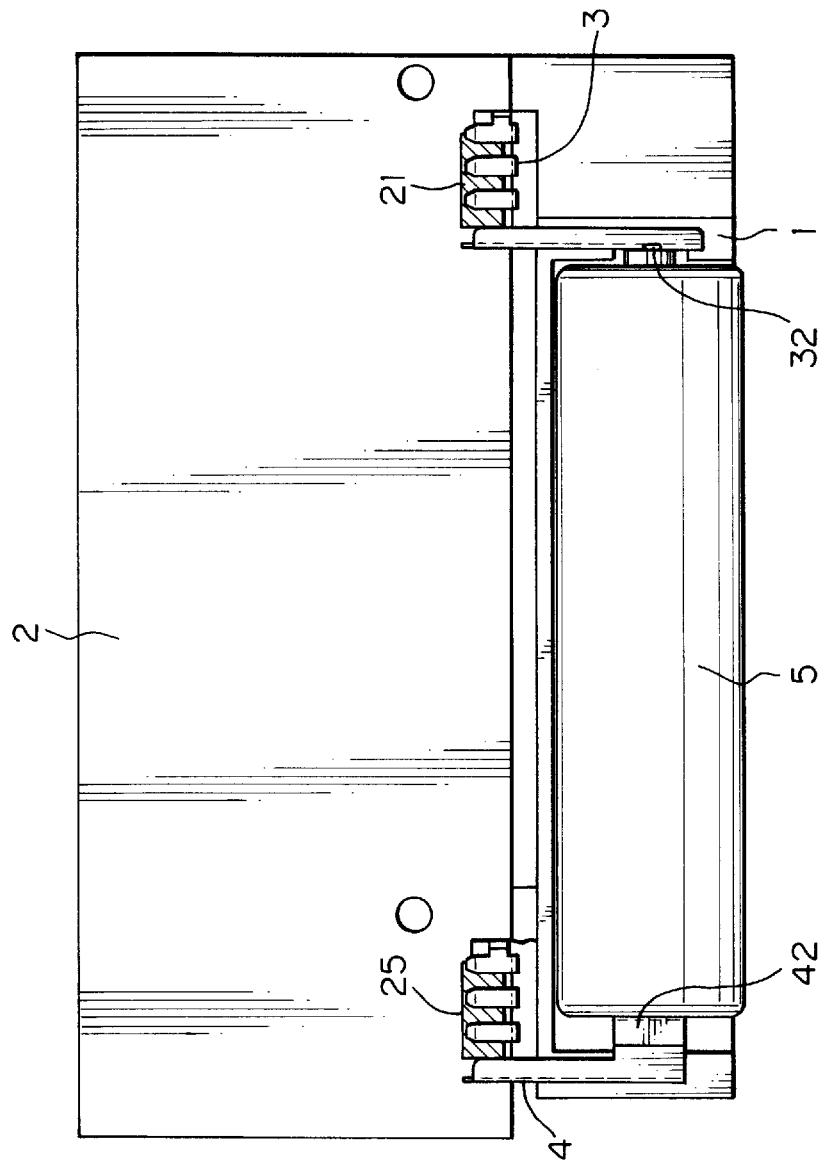
FIG. 3 is a plan view showing the embodiment in an assembled condition.
Figure 4:
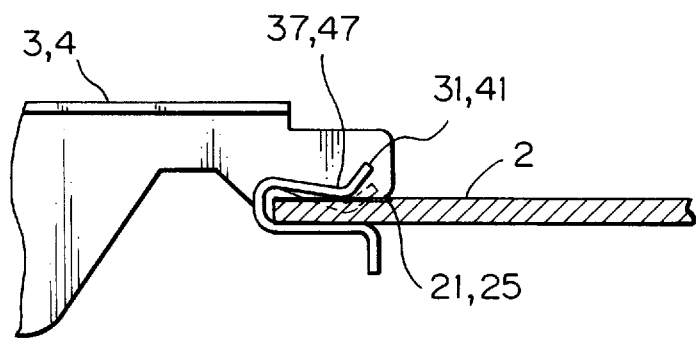
FIG. 4 is a section is an enlarged section showing how a battery terminal and an electrode provided on a printed circuit board are affixed together in the illustrative embodiment.

FIG. 3 shows the above battery terminal holding structure in an assembled condition. As shown, a battery 5 is received in the casing 1 in contact with the contact surfaces 32 and 42 of the positive and negative terminals 3 and 4. The battery 5 is therefore electrically connected to the electrodes 21 and 25 of the circuit board 2 via the bent portions 31 and 41 of the terminals 3 and 4. As shown in FIG. 4 in detail, the bent portions 31 and 41 each has the open end of the letter U dimensioned greater than the thickness of the circuit board 2. This allows the bent portions 31 and 41 to be easily slipped onto the circuit board 2. Further, the bent portions 37 and 47 each has, at its intermediate portion, a constriction 37 or 47 having a width, as measured in the up-and-down direction in FIG. 4, smaller than the thickness of the circuit board 2. When the bent portions 37 and 47 are slipped onto the circuit board 2, the constrictions 37 and 47 resiliently deform and press themselves against the electrodes 21 and 25, respectively. This surely sets up electrical conduction and surely positions the terminals 3 and 4 in the widthwise direction of the circuit board 2.

A procedure for assembling the battery terminal holding structure is as follows. First, the positive and negative terminals 3 and 4 are fitted on the circuit board 2. Specifically, the ribs 33 and 34 of the terminal 3 and the ribs 43 and 44 of the terminal 4 are respectively inserted in the notches 27 and 28 of the circuit board 2. At this instant, the bent portions 31 and 41 of the terminals 3 and 4, respectively, resiliently nip and press the electrodes 21 and 25 of the circuit board 2, as shown in FIG. 4. As a result, the terminals 3 and 4 are electrically connected to the electrodes 21 and 25, respectively.

The subassembly consisting of the printed circuit board 2 and terminals 3 and 4 is mounted to the casing 1. Specifically, the ribs 36 and 46 of the terminals 3 and 4, respectively, are inserted in and positioned by the grooves 11 and 14 of the casing 1. At this instant, the pins 12 and 13 studded on the casing 1 are respectively inserted in the holes 22 and 26 of the circuit board 2, positioning the casing 1 and circuit board 2 relatively to each other.

As shown in FIG. 3, the battery 5 is put in the assembly made up of the terminals 3 and 4, circuit board 2, and casing 1. The positive terminal and negative terminals of the battery 5 are respectively held in contact with the contact surfaces 32 of the positive terminal 3 and the contact surface 43 of the negative terminal 4. In this condition, power is fed from the battery 5 to the circuit board 2 via the terminals 3 and 4.

As stated above, the illustrative embodiment makes it needless to solder the terminals 3 and 4 to the circuit board 2, i.e., sets up electrical connection based on the pressing contact of the bent portions 31 and 41 with the electrodes 21 and 25. Also, the embodiment allows the terminals 3 and 4 and circuit board 2 to be readily separated from each other, reducing the work time. Further, as shown in FIG. 2, the casing 1, positive terminal 3, negative terminal 4 and circuit board 2 can each be easily separated from the others and recycled.

Figure 5:
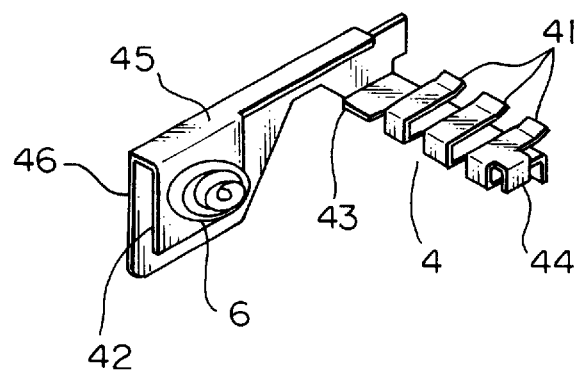
FIG. 5 is a perspective view showing a modification of the illustrative embodiment.

FIG. 5 shows a modification of the illustrative embodiment. As shown, a conical coil spring 6 is affixed to the contact surface 42 of the negative terminal 4. The contact surface 42 extends from the rib 46 via the bent wall 45. In this modification, the negative terminal of the battery 5 will contact the coil spring 6.

In the illustrative embodiment, the pins 12 and 13 and holes 22 and 26 are used to position the circuit board 2 on the casing 1. Alternatively, the pins 12 and 13 may be replaced with taps, in which case screws will be driven into the taps via the holes 22 and 26. If desired, the pins 12 and 13 may be replaced with snap-fitting members to be snap fitted in the holes 22 and 26.

In summary, in accordance with the present invention, battery terminals for connecting a battery to a printed circuit board do not have to be soldered to the circuit board. This successfully saves soldering time essential with a conventional structure, and thereby reduces the production cost. Further, the absence of soldering allows the individual structural element to be separated without resorting to the removal of solder, thereby reducing the period of time necessary for maintenance. In addition, the structural elements readily separable from each other can be recycled with ease.

Various modifications will become possible for those skilled in the art after receiving the teachings of the present disclosure without departing from the scope thereof.

What is claimed is:

1. A structure for holding battery terminals included in a miniature electronic apparatus, comprising:
    a printed circuit board loaded with electronic parts;
    a pair of resilient conductive battery terminals; and
    a casing for accommodating a battery therein, and affixed to said printed circuit board via said pair of battery terminals;

said printed circuit board comprising, at each of opposite end portions thereof, an electrode for contacting one of said pair of battery terminals, a notch adjoining said electrode for receiving and positioning the one battery terminal, and a hole for positioning said printed circuit board relative to said casing;

said pair of battery terminals each comprising a contact surface for contacting one of a positive and a negative terminal of the battery, a first rib affixed to and positioned by said casing, a second rib received in and positioned by said notch of said printed circuit board, and a plurality of bent portions each having a substantially U-shaped cross-section for resiliently nipping and pressing one of said pair of electrodes of said printed circuit board;

said casing comprising, at each of opposite end portions thereof, a groove for receiving and positioning said first rib, and a positioning member to be inserted in said hole of said printed circuit board.

2. A structure as claimed in claim 1, wherein said contact surface of one of said pair of battery terminals for contacting the negative terminal of the battery includes a coil spring.

3. A structure as claimed in claim 2, wherein said positioning member comprises a screw.

4. A structure as claimed in claim 2, wherein said positioning member comprises a snap-fitting member.

5. A structure as claimed in claim 1, wherein said positioning member comprises a screw.

6. A structure as claimed in claim 1, wherein said positioning member comprises a snap-fitting member.

* * * * *